(12) United States Patent
Lee et al.

(10) Patent No.: US 10,504,825 B2
(45) Date of Patent: Dec. 10, 2019

(54) FAN-OUT SEMICONDUCTOR PACKAGE

(71) Applicant: SAMSUNG ELECTRONICS CO., LTD., Suwon-si (KR)

(72) Inventors: Jeong Il Lee, Suwon-Si (KR); Jeong Ho Lee, Suwon-Si (KR); Jin Su Kim, Suwon-Si (KR); Bong Ju Cho, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/988,541

(22) Filed: May 24, 2018

(65) Prior Publication Data

US 2019/0139876 A1 May 9, 2019

(30) Foreign Application Priority Data

Nov. 3, 2017 (KR) .................. 10-2017-0146195

(51) Int. Cl.
*H01L 23/48* (2006.01)
*H01L 23/498* (2006.01)
(Continued)

(52) U.S. Cl.
CPC ...... *H01L 23/49822* (2013.01); *H01L 21/481* (2013.01); *H01L 21/486* (2013.01);
(Continued)

(58) Field of Classification Search
CPC ............. H01L 2224/97; H01L 2224/83; H01L 21/565; H01L 21/568; H01L 21/6835;
(Continued)

(56) References Cited

U.S. PATENT DOCUMENTS 10,199,337 B2    2/2019  Park et al.
2007/0095471 A1  5/2007  Ito et al.
(Continued)

FOREIGN PATENT DOCUMENTS

KR    10-2008-0046275 A    5/2008
KR    10-2016-0132763 A    11/2016
(Continued)

OTHER PUBLICATIONS

Office Action issued in corresponding Korean Patent Application No. 10-2017-0146195, dated May 31, 2018.

*Primary Examiner* — Robert G Bachner
(74) *Attorney, Agent, or Firm* — Sughrue Mion, PLLC

(57) ABSTRACT

A fan-out semiconductor package includes: a frame including insulating layers, wiring layers, and connection via layers, and having a recess portion having a stopper layer; a semiconductor chip having connection pads and disposed in the recess portion so that an inactive surface is connected to the stopper layer; first metal bumps disposed on the connection pads; second metal bumps disposed on an uppermost wiring layer of the wiring layers; an encapsulant covering at least portions of each of the frame, the semiconductor chip, and the first and second metal bumps and filling at least portions of the recess portion; and a connection member disposed on the frame and the active surface of the semiconductor chip and including a redistribution layer electrically connected to the connection pads and the uppermost wiring layer through the first and second metal bumps.

18 Claims, 14 Drawing Sheets

(51) Int. Cl.
  *H01L 23/00* (2006.01)
  *H01L 21/48* (2006.01)
  *H01L 23/31* (2006.01)

(52) U.S. Cl.
  CPC ...... *H01L 21/4853* (2013.01); *H01L 21/4857* (2013.01); *H01L 24/13* (2013.01); *H01L 24/16* (2013.01); *H01L 24/24* (2013.01); *H01L 24/25* (2013.01); *H01L 23/3128* (2013.01); *H01L 24/32* (2013.01); *H01L 24/73* (2013.01); *H01L 2224/13147* (2013.01); *H01L 2224/16057* (2013.01); *H01L 2224/18* (2013.01); *H01L 2224/244* (2013.01); *H01L 2224/24101* (2013.01); *H01L 2224/24227* (2013.01); *H01L 2224/25171* (2013.01); *H01L 2224/32227* (2013.01); *H01L 2224/73* (2013.01); *H01L 2224/73209* (2013.01); *H01L 2224/73267* (2013.01); *H01L 2924/15153* (2013.01)

(58) Field of Classification Search
  CPC ... H01L 2221/68359; H01L 2224/0231; H01L 2224/02371; H01L 2224/02372; H01L 2224/03462; H01L 2224/0361; H01L 2224/0362; H01L 2224/0382; H01L 2224/0401; H01L 2224/04105; H01L 2224/05012; H01L 2224/05024; H01L 2224/12105; H01L 2224/32225; H01L 2224/73267; H01L 2224/92244; H01L 23/3107; H01L 24/03; H01L 24/05; H01L 24/11; H01L 24/13; H01L 24/19; H01L 24/20

See application file for complete search history.

(56) References Cited

U.S. PATENT DOCUMENTS

| | | | |
|---|---|---|---|
| 2009/0309179 | A1 | 12/2009 | Hsu et al. |
| 2010/0006330 | A1 | 1/2010 | Fu et al. |
| 2012/0287586 | A1 | 11/2012 | Mikado et al. |
| 2014/0070396 | A1 | 3/2014 | Kyozuka et al. |
| 2016/0118332 | A1* | 4/2016 | Lin .................. H01L 22/20 257/773 |
| 2016/0338202 | A1* | 11/2016 | Park .................. H01L 23/48 |
| 2017/0092623 | A1 | 3/2017 | Chen et al. |
| 2017/0141055 | A1 | 5/2017 | Liu et al. |

FOREIGN PATENT DOCUMENTS

| | | |
|---|---|---|
| KR | 10-2017-0071826 A | 6/2017 |
| TW | 200952143 | 12/2009 |
| TW | 201019438 A | 5/2010 |
| TW | 201021640 A1 | 6/2010 |
| TW | 201304620 A1 | 1/2013 |
| TW | 201709777 A | 3/2017 |

* cited by examiner

FAN-OUT SEMICONDUCTOR PACKAGE

CROSS-REFERENCE TO RELATED APPLICATION(S)

This application claims the benefit of priority to Korean Patent Application No. 10-2017-0146195 filed on Nov. 3, 2017, in the Korean Intellectual Property Office, the disclosure of which is incorporated herein by reference in its entirety.

TECHNICAL FIELD

The present disclosure relates to a semiconductor package, and more particularly, to a fan-out semiconductor package in which electrical connection structures may extend outwardly of a region in which a semiconductor chip is disposed.

BACKGROUND

A significant recent trend in the development of technology related to semiconductor chips has been reductions in the size of semiconductor chips. Therefore, in the field of package technology, in accordance with a rapid increase in demand for small-sized semiconductor chips, or the like, the implementation of a semiconductor package, having a compact size while including a plurality of pins, has been demanded.

One type of semiconductor package technology suggested to satisfy the technical demand, described above, is a fan-out semiconductor package. Such a fan-out package has a compact size and may allow a plurality of pins to be implemented by redistributing connection terminals outwardly of a region in which a semiconductor chip is disposed.

SUMMARY

An aspect of the present disclosure may provide a fan-out semiconductor package in which a frame including a blind recess portion is provided and a semiconductor chip is disposed in the recess portion, and a problem such as copper (Cu) burring, or the like, may thus be solved in spite of using a grinding process.

According to an aspect of the present disclosure, a fan-out semiconductor package may be provided, in which a frame having a blind recess portion formed by a stopper layer is provided, a semiconductor chip is disposed in the recess portion, and metal bumps are disposed on a wiring layer of the frame and connection pads of the semiconductor chip.

According to an aspect of the present disclosure, a fan-out semiconductor package may include: a frame including a plurality of insulating layers, a plurality of wiring layers disposed on the plurality of insulating layers, and a plurality of connection via layers penetrating through the plurality of insulating layers and electrically connecting the plurality of wiring layers to each other, and having a recess portion having a stopper layer disposed on a bottom surface thereof; a semiconductor chip having connection pads, an active surface on which the connection pads are disposed, and an inactive surface opposing the active surface, and disposed in the recess portion so that the inactive surface is connected to the stopper layer; first metal bumps disposed on the connection pads of the semiconductor chip; second metal bumps disposed on an uppermost wiring layer of the plurality of wiring layers; an encapsulant covering at least portions of each of the frame, the semiconductor chip, and the first and second metal bumps and filling at least portions of the recess portion; and a connection member disposed on the frame and the active surface of the semiconductor chip and including a redistribution layer electrically connected to the connection pads and the uppermost wiring layer through the first and second metal bumps.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
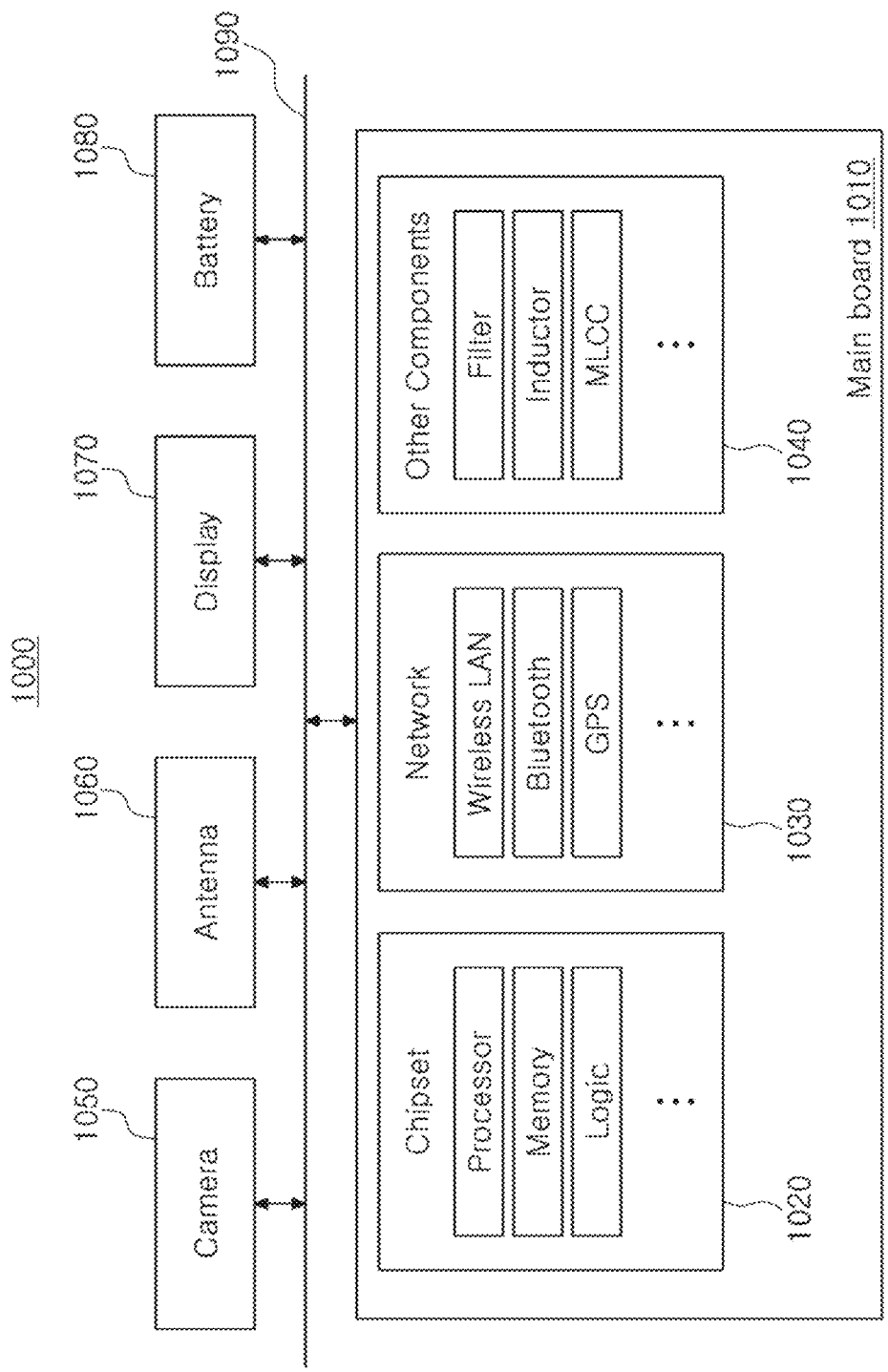
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
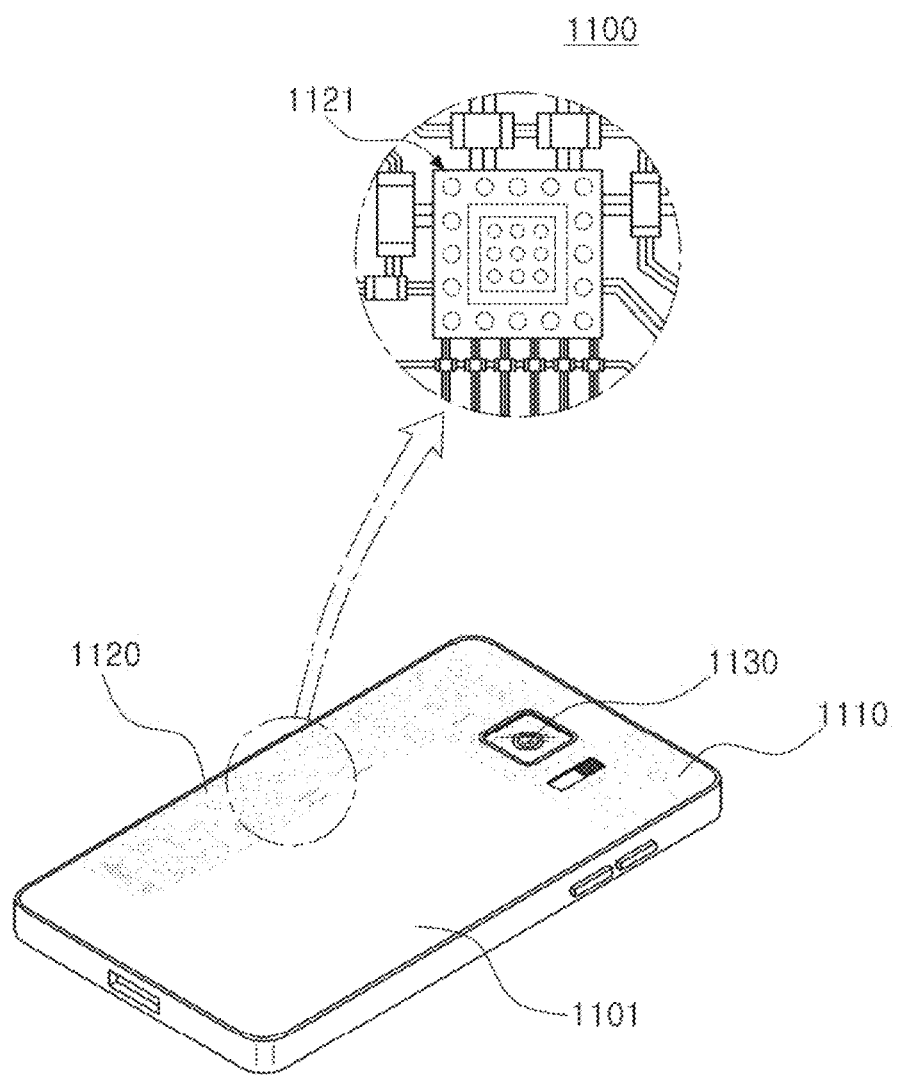
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a mainboard 1110 may be accommodated in a body 1101 of a smartphone 1100, and various electronic components 1120 may be physically or electrically connected to the mainboard 1110. In addition, other components that may or may not be physically or electrically connected to the mainboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured using the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
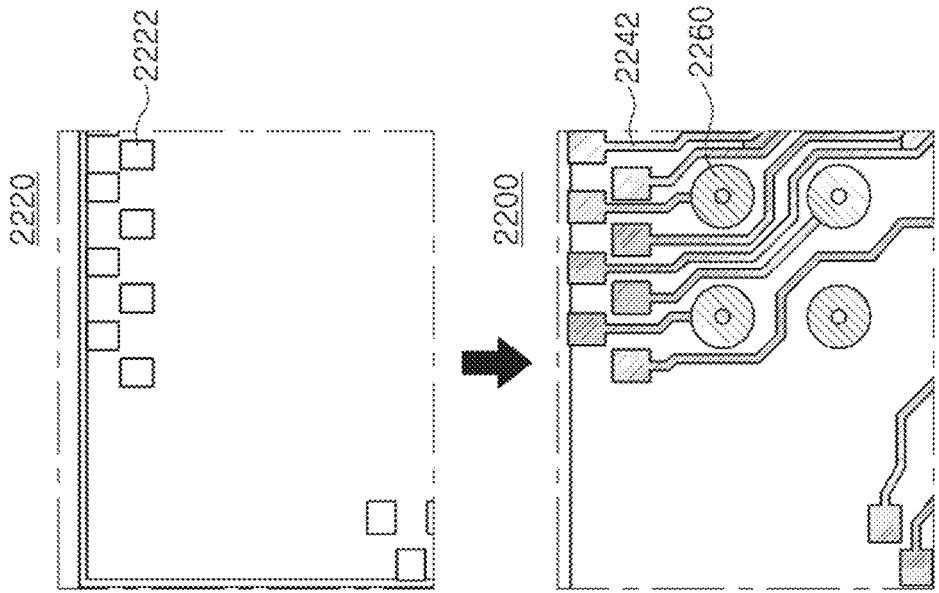
FIGS. 3A and 3B are schematic cross-sectional views illustrating states of a fan-in semiconductor package before and after being packaged.
Figure 3A:
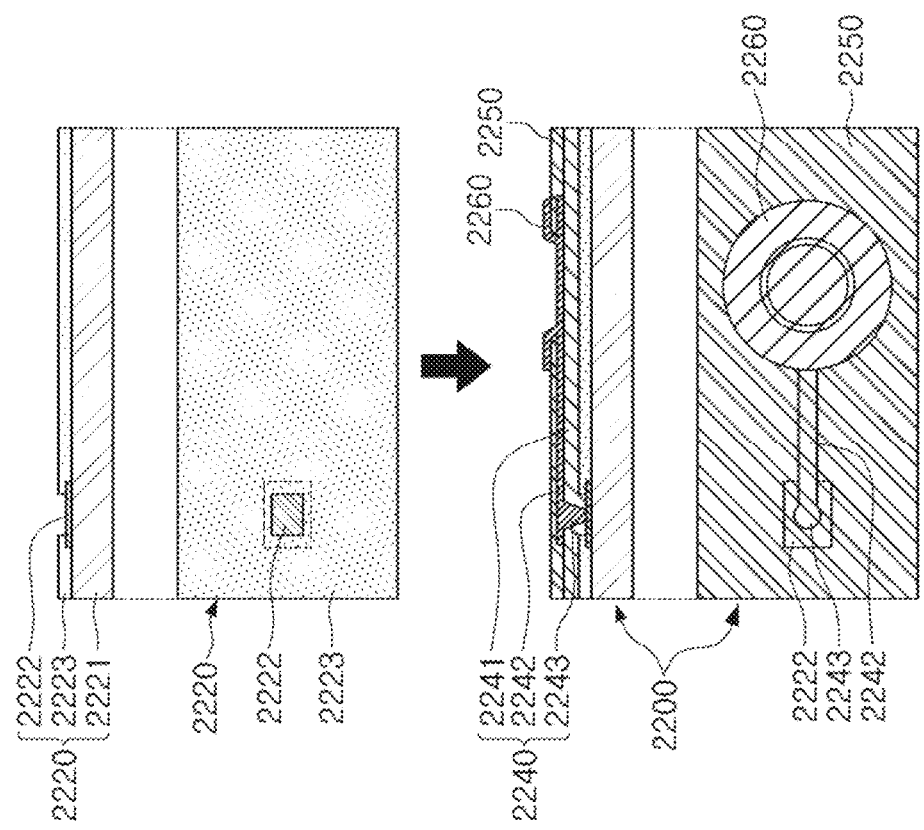

FIGS. 3A and 3B are schematic cross-sectional views illustrating states of a fan-in semiconductor package before and after being packaged.

Figure 4:
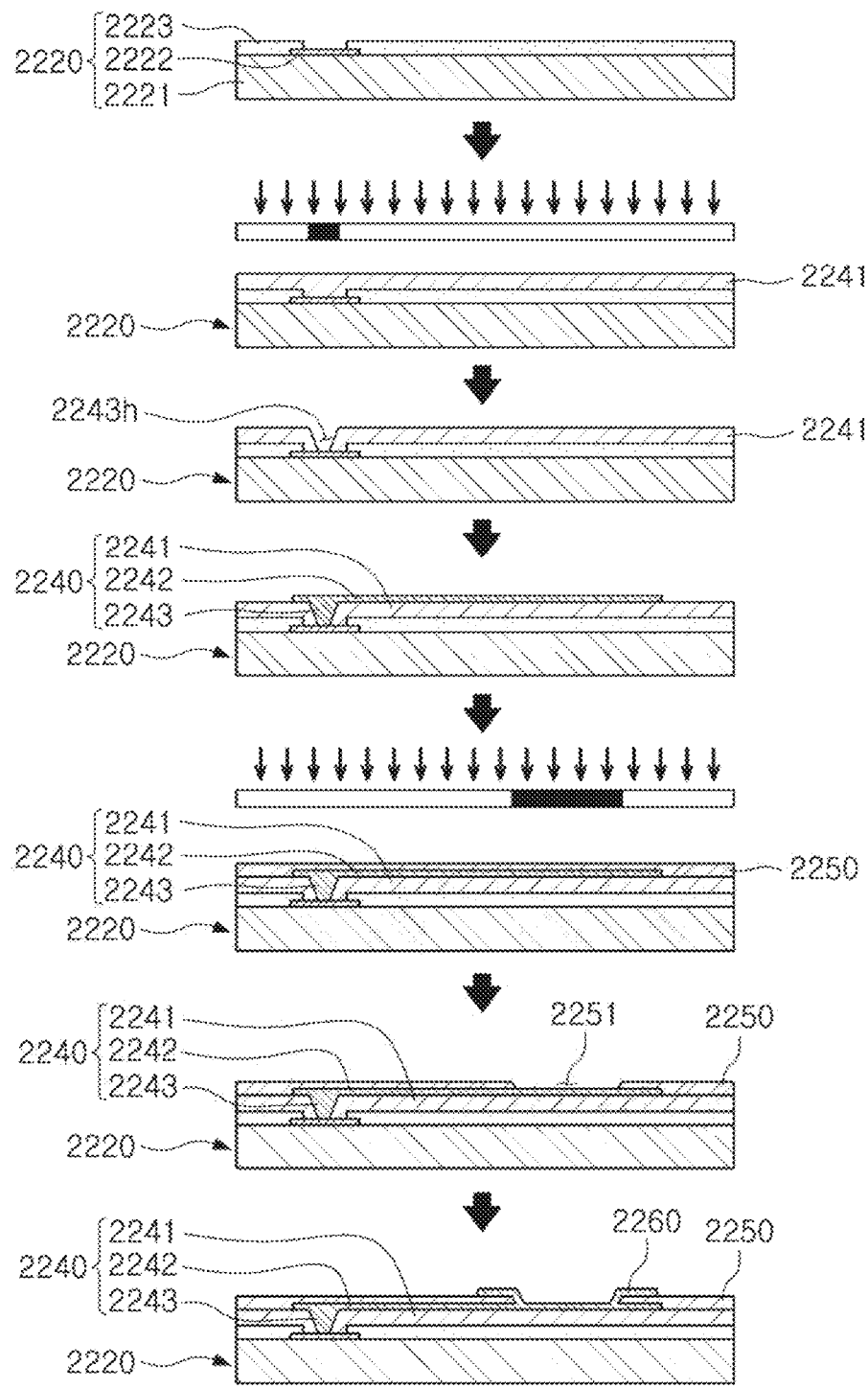
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
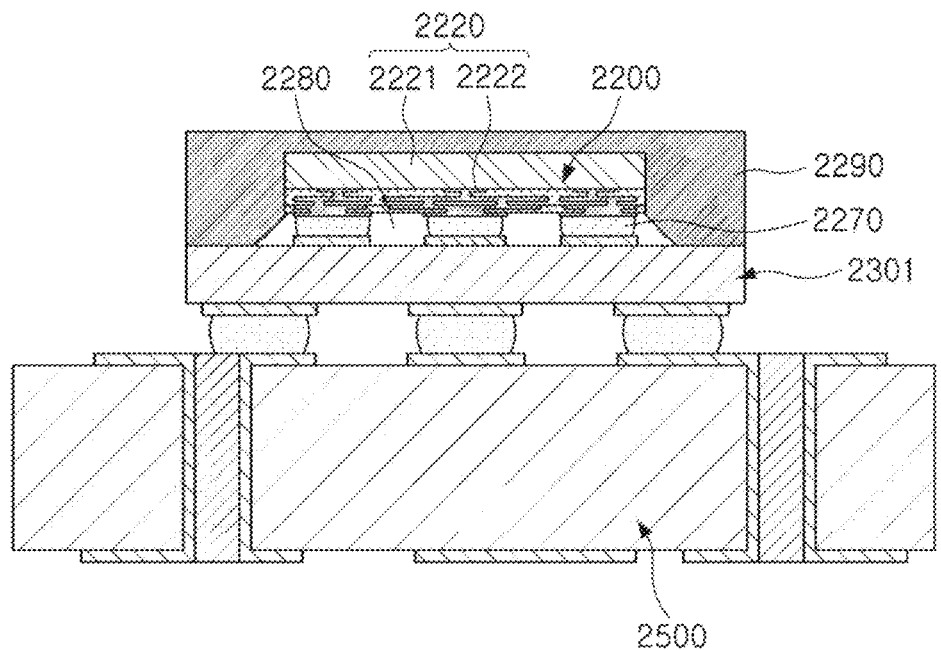
FIG. 5 is a schematic cross-sectional view illustrating a case in which a fan-in semiconductor package is mounted on a ball grid array (BGA) substrate and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
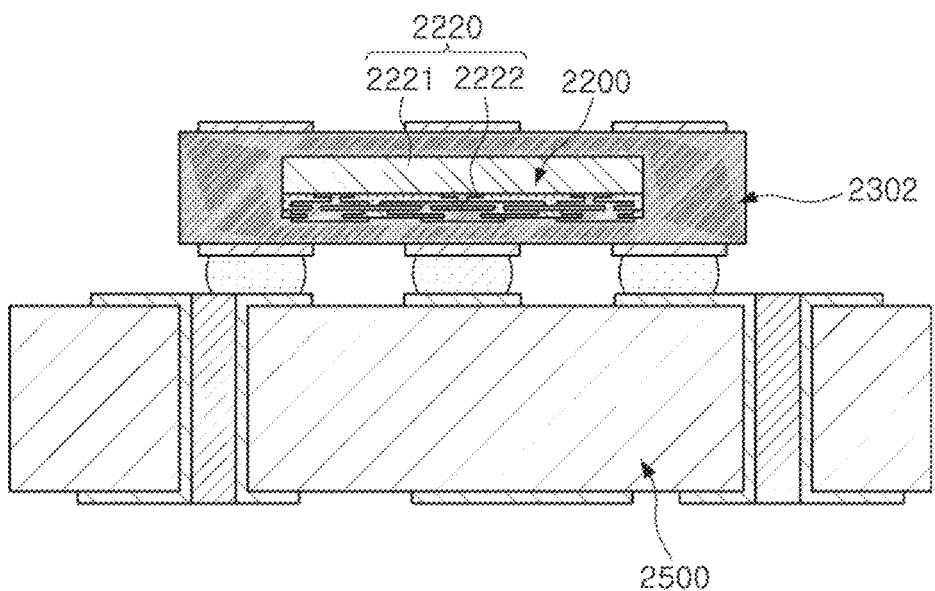
FIG. 6 is a schematic cross-sectional view illustrating a case in which a fan-in semiconductor package is embedded in a BGA substrate and is ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-out Semiconductor Package

Figure 7:
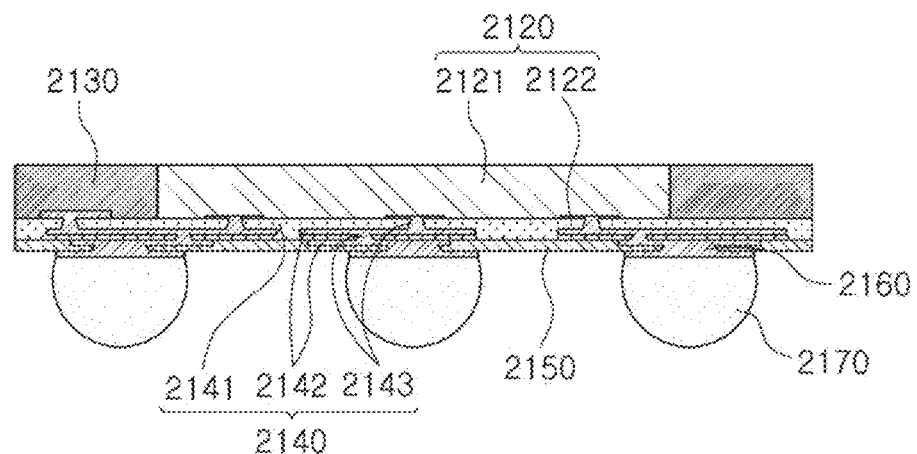
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
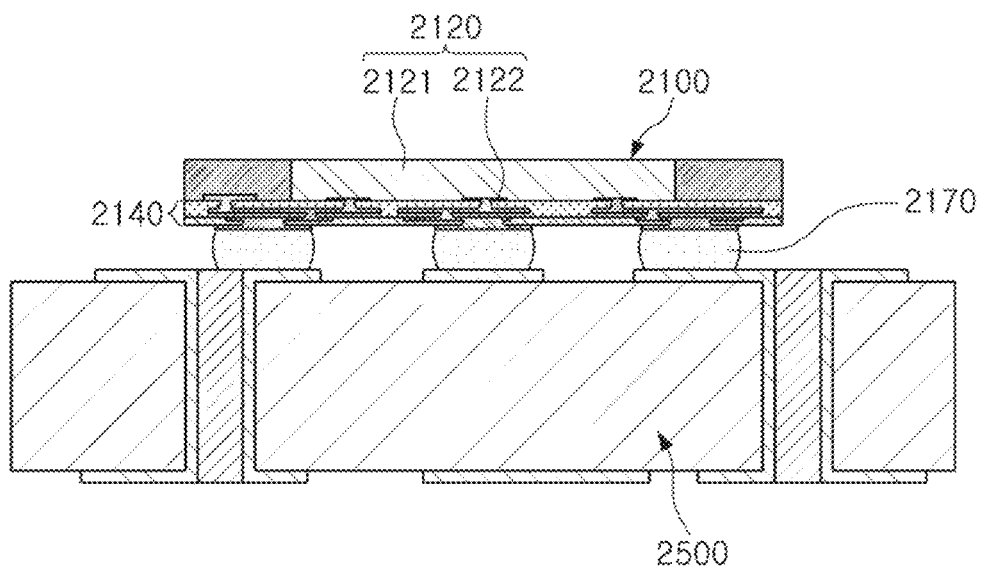
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

A fan-out semiconductor package in which a frame having a blind recess portion formed by a stopper layer is provided will hereinafter be described with reference to the drawings.

Figure 9:
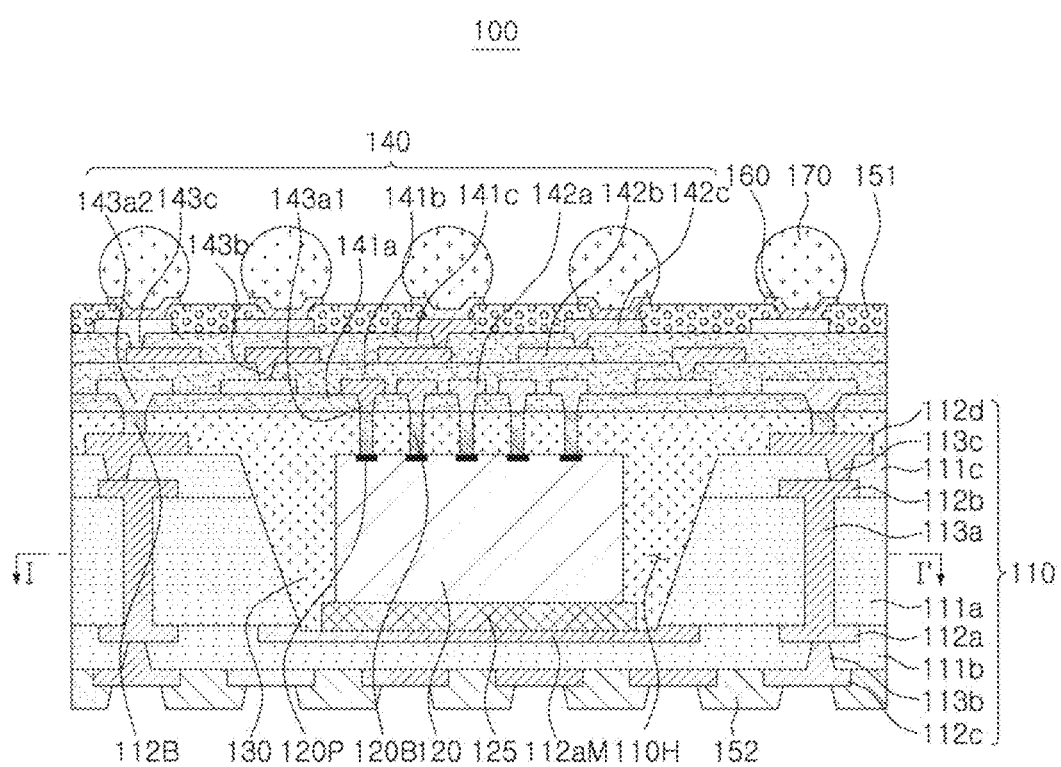
FIG. 9 is a schematic cross-sectional view illustrating an example of a fan-out semiconductor package.

FIG. 9 is a schematic cross-sectional view illustrating an example of a fan-out semiconductor package.

Figure 10:
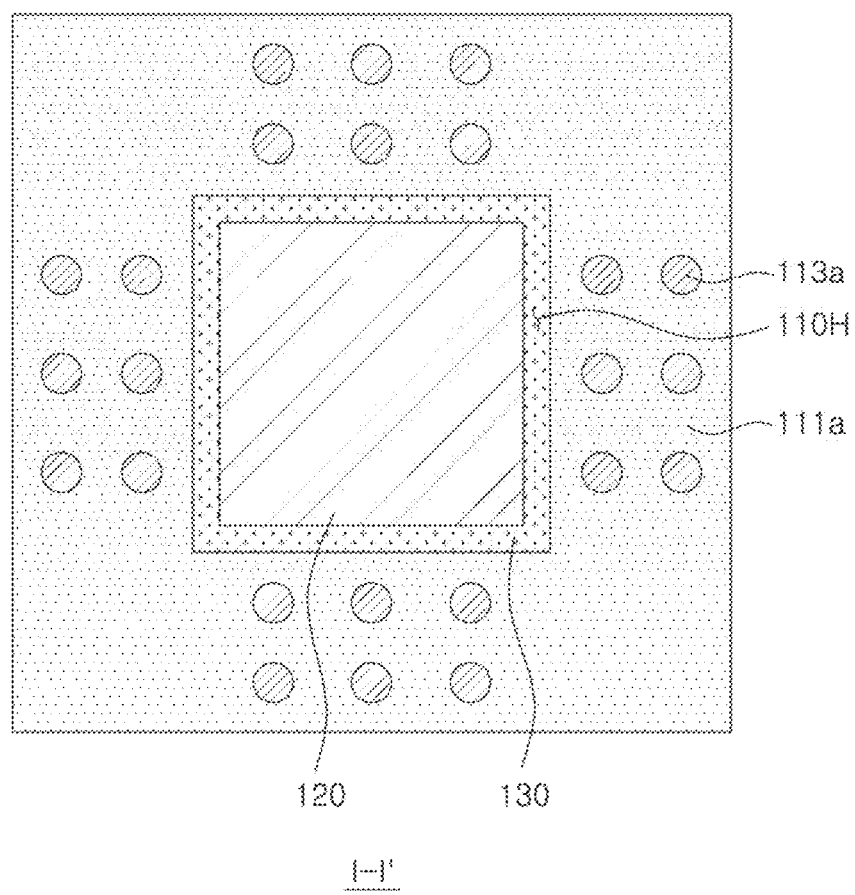
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Referring to FIGS. 9 and 10, a fan-out semiconductor package 100 according to an exemplary embodiment in the present disclosure may include a frame 110 having a recess portion 110H having a blind form of which a first surface is covered with a stopper layer 112aM and a second surface opposing the first surface is opened, a semiconductor chip 120 having an active surface having connection pads 120P disposed thereon and an inactive surface opposing the active surface and disposed in the recess portion 110H so that the inactive surface is attached to the stopper layer 112aM, an encapsulant 130 encapsulating at least portions of each of the frame 110 and the semiconductor chip 120 and filling at least portions of the recess portion 110H, and a connection member 140 disposed on the frame 110, the encapsulant 130, and the active surface of the semiconductor chip 120. In addition, the fan-out semiconductor package 100 according to the exemplary embodiment may further include a first passivation layer 151 disposed on the connection member 140 and having openings exposing at least portions of a redistribution layer 142c of the connection member 140, a second passivation layer 152 disposed on the frame 110 and having openings exposing at least portions of a wiring layer 112c of the frame 110, underbump metal layers 160 disposed in the openings of the first passivation layer 151 and electrically connected to the exposed redistribution layer 142c, and electrical connection structures 170 disposed on the underbump metal layers 160 and electrically connected to the exposed redistribution layer 142c through the underbump metal layers 160, if necessary.

Meanwhile, the frame 110 may include wiring layers 112a, 112b, 112c, and 112d electrically connected to each other through connection via layers 113a, 113b, and 113c, the connection member 140 may include redistribution layers 142a, 142b, and 142c electrically connected to each other through connection vias 143a1, 143a2, 143b, and 143c, and the connection pads 120P of the semiconductor chip 120 may be electrically connected to the wiring layers 112a, 112b, 112c, and 112d and the redistribution layers 142a, 142b, and 142c. In this case, the redistribution layer 142a may be electrically connected to the connection pads 120P and the wiring layer 112d respectively through metal bumps 120B and 112B such as copper (Cu) posts, or the like. In more detail, the redistribution layer 142a may be electrically connected to the connection pads 120P and the wiring layer 112d through the connection vias 143a1 and 143a2 and the metal bumps 120B and 112B each connected to the connection vias 143a1 and 143a2.

Figure 16:
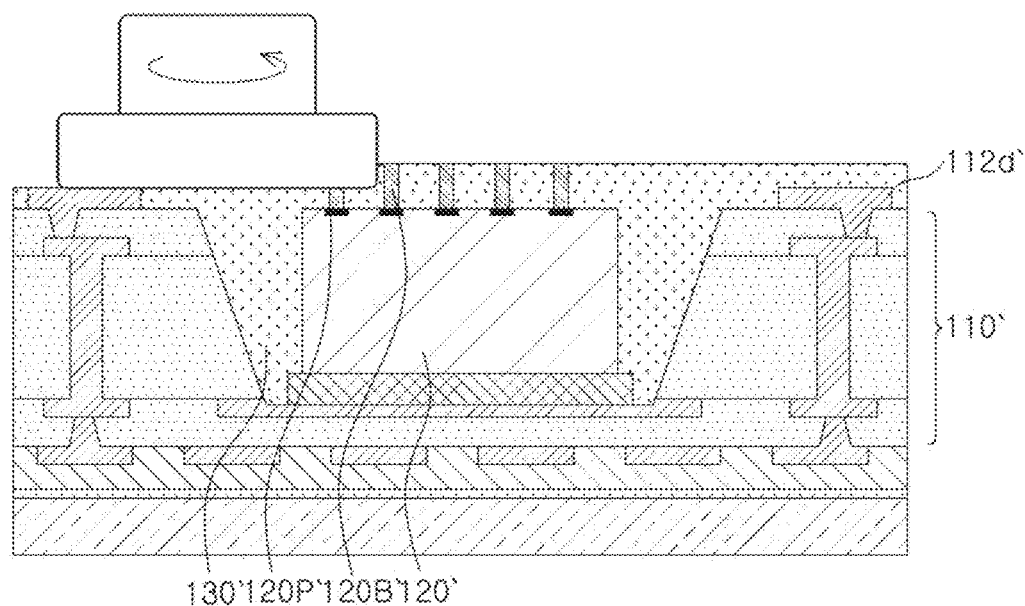
FIG. 16 is a schematic cross-sectional view illustrating a grinding process when a metal bump is not formed.
Figure 17:
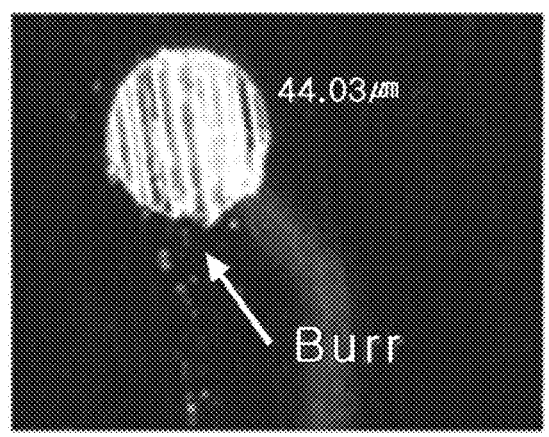
FIG. 17 is a schematic plan view illustrating copper burring generated as a result of the grinding process of FIG. 16.

Meanwhile, when a frame having a recess portion having a blind form is provided and a semiconductor chip is disposed in the recess portion and is then encapsulated, copper posts, or the like, are generally formed in advance on connection pads of the semiconductor chip, and a grinding process is performed in order to form a flat surface for forming a connection member. In this case, when separate metal bumps are not introduced into a frame 110', a grinding process is performed so that a surface of a wiring layer 112d' of the frame 110' and copper posts 120B' formed on connection pads 120P' of a semiconductor chip 120' are exposed, as illustrated in FIG. 16. However, since the surface of the wiring layer 112d' has a surface area greater than those of surfaces of the copper posts 120B', it is likely that copper (Cu) constituting the wiring layer 112d' will be spread in the grinding process. Resultantly, as illustrated in FIG. 17, copper (Cu) residues may become foreign materials and be stuck to a grinding wheel to decrease processability. In addition, copper burring generated in this process may generate an unexpected electrical short-circuit.

On the other hand, in the fan-out semiconductor package 100 according to the exemplary embodiment, the metal bumps 120B may be formed on the connection pads 120P, and the metal bumps 112B may also be formed on the wiring layer 112d of the frame 110. The metal bumps 120B and 112B may be copper posts having a rectangular cross-sectional shape. In this case, as seen from a process to be described below, surfaces of the metal bumps 120B and 112B may be exposed in a grinding process, and the wiring layer 112d may not be ground in the grinding process. Since surfaces of the metal bumps 112B generally have surface areas smaller than that of a surface of the wiring layer 112d, even though the surfaces of the metal bumps 112B are ground in the grinding process, generation of copper residues may be significantly decreased. Resultantly, foreign materials stuck to the grinding wheel may be decreased, such that processability may be improved.

The respective components included in the fan-out semiconductor package 100 according to the exemplary embodiment will hereinafter be described in more detail.

The frame 110 may improve rigidity of the fan-out semiconductor package 100 depending on certain materials, and serve to secure uniformity of a thickness of an encapsulant 130. In addition, the frame 110 may include the wiring layers 112a, 112b, 112c, and 112d, and the connection via layers 113a, 113b, and 113c, and thus serve as a connection member. The frame 110 may include the wiring layer 112c disposed on the inactive surface of the semiconductor chip 120, and thus provide a backside wiring layer for the semiconductor chip 120 without performing a process of forming a separate backside wiring layer. The frame 110 may have the recess portion 110H formed using the stopper layer 112aM as a stopper and having the blind form, and the inactive surface of the semiconductor chip 120 may be attached to the stopper layer 112aM through any known adhesive member 125 such as a die attach film (DAF), or the like. The recess portion 110H may be formed by a sandblast process as described below. In this case, the recess portion 110H may have a tapered shape. That is, walls of the recess portion 110H may have a predetermined gradient in relation to the stopper layer 112aM. In this case, a process of aligning the semiconductor chip 120 may be easier, and a yield of the semiconductor chip 120 may thus be improved.

The frame 110 may include a first insulating layer 111a, first and second wiring layers 112a and 112b disposed, respectively, on first and second surfaces of the first insulating layer 111a, a second insulating layer 111b disposed on the first surface of the first insulating layer 111a and covering the first wiring layer 112a, a third wiring layer 112c disposed on the second insulating layer 111b, a third insulating layer 111c disposed on the second surface of the first insulating layer 111a and covering the second wiring layer 112b, and a fourth wiring layer 112d disposed on the third insulating layer 111c. In addition, the frame 110 may include first connection via layers 113a penetrating through the first insulating layer 111a and electrically connecting the first and second wiring layers 112a and 112b to each other, second connection via layers 113b penetrating through the second insulating layer 111b and electrically connecting the first and third wiring layers 112a and 112c to each other, and third connection via layers 113c penetrating through the third insulating layer 111c and electrically connecting the second and fourth wiring layers 112b and 112d to each other. The first to fourth wiring layers 112a, 112b, 112c, and 112d may be electrically connected to each other, and may be electrically connected to connection pads 120P of the semiconductor chip 120. The recess portion 110H may penetrate through the first and third insulating layers 111a and 111c, but may not penetrate through the second insulating layer 111b. The stopper layer 112aM may be disposed on the first surface of the first insulating layer 111a and be covered with the second insulating layer 111b.

The stopper layer 112aM may be a metal plate including a metal such as copper (Cu), or the like. Alternatively, the stopper layer 112aM may include a material of which an etch rate for a sandblast process is lower than that of the metal. For example, a dry film photoresist may be used as the stopper layer. A first surface of the stopper layer 112aM may be covered with the second insulating layer, and at least portions of a second surface of the stopper layer 112aM opposing the first surface may be exposed by the recess portion 110H. A thickness of an edge region of the stopper layer 112aM in contact with the first insulating layer 111a may be greater than that of a region of the stopper layer 112aM exposed from the first insulating layer 111a by the recess portion 110H. The reason is that portions of the exposed region may also be removed in a sandblast process.

A material of each of the insulating layers 111a, 111b, and 111c may be an insulating material. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. When a material having high rigidity, such as prepreg including a glass fiber, or the like, is used as the material of each of the insulating layers 111a, 111b, and 111c, the frame 110 may be utilized as a support member for controlling warpage of the fan-out semiconductor package 100.

The first insulating layer 111a may have a thickness greater than those of the second insulating layer 111b and the third insulating layer 111c. The first insulating layer 111a may be relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating layer 111a may be, for example, prepreg in which an insulating resin is impregnated together with an inorganic filler in a glass fiber, and the second insulating layer 111b and the third insulating layer 111c may be an ABF or a PID film including an inorganic filler and an insulating resin. However, the materials of the first insulating layer 111a and the second and third insulating layers 111b and 111c are not limited thereto. Similarly, the first connection via layer 113a penetrating through the first insulating layer 111a may have a diameter greater than those of the second and third connection via layers 113b and 113c each penetrating through the second and third insulating layers 111b and 111c.

The wiring layers 112a, 112b, 112c, and 112d may redistribute the connection pads 120P of the semiconductor chip 120 together with the redistribution layers 142a, 142b, and 142c. A material of each of the wiring layers 112a, 112b, 112c, and 112d may be a conductive material such as copper (Cu), aluminum (Al), silver (Ag), tin (Sn), gold (Au), nickel (Ni), lead (Pb), titanium (Ti), or alloys thereof. The wiring layers 112a, 112b, 112c, and 112d may perform various functions depending on designs of corresponding layers. For example, the wiring layers 112a, 112b, 112c, and 112d may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a, 112b, 112c, and 112d may include various pad patterns, and the like.

Thicknesses of the wiring layers 112a, 112b, 112c, and 112d may be greater than those of redistribution layers 142a, 142b, and 142c of a connection member 140. Since the frame 110 is manufactured using a substrate process, the wiring layers 112a, 112b, 112c, and 112d may be formed to have a relatively large thickness, but since the connection member 140 is manufactured using a semiconductor process, the redistribution layers 142a, 142b, and 142c may be formed to have a relatively small thickness.

The connection via layers 113a, 113b, and 113c may electrically connect the wiring layers 112a, 112b, 112c, and 112d formed on different layers to each other, resulting in an electrical path in the frame 110. A material of each of the connection via layers 113a, 113b, and 113c may be a conductive material. Each of the connection via layers 113a, 113b, and 113c may be completely filled with the conductive material, or the conductive material may also be formed along a wall of each of via holes. The first connection via layer 113a may have a cylindrical shape or a hourglass shape, and the second and third connection via layers 113b and 113c may have tapered shapes. In this case, the second and third connection via layers 113b and 113c may have tapered shapes of which directions are opposite to each other in relation to the first insulating layer 111a.

The semiconductor chip 120 may be an integrated circuit (IC) provided in an amount of several hundred to several million or more elements integrated in a single chip. The semiconductor chip 120 may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto.

The semiconductor chip 120 may be formed on the basis of an active wafer. In this case, a base material of a body of the semiconductor chip 120 may be silicon (Si), germanium (Ge), gallium arsenide (GaAs), or the like. Various circuits may be formed on the body. The connection pads 120P may electrically connect the semiconductor chip 120 to other components. A material of each of the connection pads 120P may be a conductive material such as aluminum (Al), or the like. A passivation layer such as an oxide film, a nitride film, or the like, exposing the connection pads 120P may be formed on the body, and may be a double layer of an oxide layer and a nitride layer. An insulating layer, and the like, may also be further disposed in required positions. The semiconductor chip 120 may be a bare die, but may further include a redistribution layer formed on the active surface thereof, if necessary.

The encapsulant 130 may protect the frame 110, the semiconductor chip 120, and the like. An encapsulation form of the encapsulant 130 is not particularly limited, but may be a form in which the encapsulant 130 surrounds at least portions of the frame 110, the semiconductor chip 120, and the like. For example, the encapsulant 130 may cover at least portions of the frame 110, and fill spaces between the walls of the recess portion 110H and side surfaces of the semiconductor chip 120. The encapsulant 130 may fill the recess portion 110H to thus serve as an adhesive and reduce buckling of the semiconductor chip 120 depending on certain materials. Surfaces of the metal bumps 120B and 112B connected to a redistribution layer 142a may be disposed on the same level as that of a surface of the encapsulant 130 in contact with an insulating layer 141a. The same level may conceptually include a slight error.

A material of the encapsulant 130 is not particularly limited. For example, an insulating material may be used as the material of the encapsulant 130. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a photoimagable encapsulant (PIE) resin may also be used as the insulating material.

The connection member 140 may redistribute the connection pads 120P of the semiconductor chip 120, and may electrically connect the wiring layers 112a, 112b, 112c, and 112d of the frame 110 to the connection pads 120P of the semiconductor chip 120. Several tens to several millions of connection pads 120P having various functions may be redistributed by the connection member 140, and may be physically or electrically externally connected through the electrical connection structures 170 depending on the functions.

The connection member 140 may include a first insulating layer 141a disposed on the frame 110, the encapsulant 130, and the active surface of the semiconductor chip 120, a first redistribution layer 142a disposed on the first insulating layer 141a, first connection vias 143a1 and 143a2 penetrating through the first insulating layer 141a and electrically connecting the first redistribution layer 142a to the metal bumps 120B and 112B, a second insulating layer 141b disposed on the first insulating layer 141a and covering the first redistribution layer 142a, a second redistribution layer 142b disposed on the second insulating layer 141b, second connection vias 143b penetrating through the second insulating layer 141b and electrically connecting the first and second redistribution layers 142a and 142b to each other, a third insulating layer 141c disposed on the second insulating layer 111b and covering the second redistribution layer 142b, a third redistribution layer 142c disposed on the third insulating layer 141c, and third connection vias 143c penetrating through the third insulating layer 141c and electrically connecting the second and third redistribution layers 142b and 142c to each other. The numbers of insulating layers, redistribution layers, via layers of the connection member 140 may be more than or less than those illustrated in the drawing.

A material of each of the insulating layers 141a, 141b, and 141c may be an insulating material. In this case, in addition to the insulating material as described above, a photosensitive insulating material such as a photoimagable dielectric (PID) resin may also be used as the insulating material. That is, the insulating layers 141a, 141b, and 141c may be photosensitive insulating layers. When the insulating layers 141*a*, 141*b*, and 141*c* have photosensitive properties, the insulating layers 141*a*, 141*b*, and 141*c* may be formed to have a smaller thickness, and fine pitches of the connection vias 143*a*1, 143*a*2, 143*b*, and 143*c* may be achieved more easily. The insulating layers 141*a*, 141*b*, and 141*c* may be photosensitive insulating layers including an insulating resin and an inorganic filler. When the insulating layers 141*a*, 141*b*, and 141*c* are multiple layers, the materials of the insulating layers 141*a*, 141*b*, and 141*c* may be the same as each other, and may also be different from each other, if necessary. When the insulating layers 141*a*, 141*b*, and 141*c* are the multiple layers, the insulating layers 141*a*, 141*b*, and 141*c* may be integrated with one another depending on a process, such that boundaries thereamong may also not be apparent.

The redistribution layers 142*a*, 142*b*, and 142*c* may serve to substantially redistribute the connection pads 120P. A material of each of the redistribution layers 142*a*, 142*b*, and 142*c* may be a conductive material such as copper (Cu), aluminum (Al), silver (Ag), tin (Sn), gold (Au), nickel (Ni), lead (Pb), titanium (Ti), or alloys thereof. The redistribution layers 142*a*, 142*b*, and 142*c* may perform various functions depending on designs of corresponding layers. For example, the redistribution layers 142*a*, 142*b*, and 142*c* may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142*a*, 142*b*, and 142*c* may include various pad patterns, and the like.

The connection vias 143*a*1, 143*a*2, 143*b*, and 143*c* may electrically connect the redistribution layers 142*a*, 142*b*, and 142*c*, the metal bumps 120B and 112B, and the like, formed on different layers to each other, resulting in an electrical path in the fan-out semiconductor package 100. A material of each of the connection vias 143*a*1, 143*a*2, 143*b*, and 143*c* may be a conductive material such as copper (Cu), aluminum (Al), silver (Ag), tin (Sn), gold (Au), nickel (Ni), lead (Pb), titanium (Ti), or alloys thereof. Each of the connection vias 143*a*1, 143*a*2, 143*b*, and 143*c* may be completely filled with the conductive material, or the conductive material may also be formed along a wall of each of via holes. In addition, each of the connection vias 143*a*1, 143*a*2, 143*b*, and 143*c* may have a tapered shape, or the like. Each of 1-1-th connection vias 143*a*1 may have the same height as that of each of 1-2-th connection vias 143*a*2.

The redistribution layer 142*a* may be electrically connected to the connection pads 120P and the wiring layer 112*d* through the metal bumps 120B and 112B such as the copper (Cu) posts, or the like. In more detail, the redistribution layer 142*a* may be electrically connected to the connection pads 120P and the wiring layer 112*d* through the connection vias 143*a*1 and 143*a*2 and the metal bumps 120B and 112B each connected to the connection vias 143*a*1 and 143*a*2. That is, the metal bumps 120B may be formed on the connection pads 120P, and the metal bumps 112B may also be formed on the wiring layer 112*d* of the frame 110. The metal bumps 120B and 112B may be the copper posts having the rectangular cross-sectional shape. In this case, as seen from a process to be described below, the surfaces of the metal bumps 120B and 112B may be exposed in the grinding process, and the wiring layer 112*d* may not be ground in the grinding process. Since the surfaces of the metal bumps 112B generally have the surface areas smaller than that of the surface of the wiring layer 112*d*, even though the surfaces of the metal bumps 112B are ground in the grinding process, the generation of the copper residues may be significantly decreased. Resultantly, the foreign materials stuck to the grinding wheel may be decreased, such that the processability may be improved.

The first passivation layer 151 may protect the connection member 140 from external physical or chemical damage. The first passivation layer 151 may have the openings exposing at least portions of the third redistribution layer 142*c* of the connection member 140. The number of openings formed in the first passivation layer 151 may be several tens to several millions. A material of the first passivation layer 151 is not particularly limited. For example, an insulating material may be used as the material of the first passivation layer 151. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

The second passivation layer 152 may protect the frame 110 from external physical or chemical damage. The second passivation layer 152 may have the openings exposing at least portions of the third wiring layer 112*c* of the frame 110. The number of openings formed in the second passivation layer 152 may be several tens to several millions. A material of the second passivation layer 152 is not particularly limited. For example, an insulating material may be used as the material of the second passivation layer 152. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

The underbump metal layers 160 may improve connection reliability of the electrical connection structures 170 to improve board level reliability of the fan-out semiconductor package 100. The underbump metal layers 160 may be connected to the redistribution layer 142*c* of the connection member 140 exposed through the openings of the first passivation layer 151. The underbump metal layers 160 may be formed in the openings of the first passivation layer 151 by any known metallization method using any known conductive material such as a metal, but are not limited thereto.

The electrical connection structures 170 may physically and/or electrically externally connect the fan-out semiconductor package 100. For example, the fan-out semiconductor package 100 may be mounted on the mainboard of the electronic device through the electrical connection structures 170. Each of the electrical connection structures 170 may be formed of a conductive material, for example, a solder, or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, but may be suitably modified depending on design particulars. For example, the electrical connection structures 170 may be provided in an amount of several tens to several thousands according to the number of connection pads 120P, or may be provided in an amount of several tens to several thousands or more or several tens to several thousands or less. When the electrical connection structures 170 are solder balls, the electrical connection structures 170 may cover side surfaces of the underbump metal layers 160 extending onto one surface of the first passivation layer 151, and connection reliability may be more excellent.

At least one of the electrical connection structures 170 may be disposed in a fan-out region. The fan-out region refers to a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Meanwhile, although not illustrated in the drawings, a metal thin film may be formed on the walls of the recess portion 110H, if necessary, in order to dissipate heat or block electromagnetic waves. In addition, a plurality of semiconductor chips 120 performing functions that are the same as or different from each other may be disposed in the recess portion 110H, if necessary. In addition, a separate passive component such as an inductor, a capacitor, or the like, may be disposed in the recess portion 110H, if necessary. In addition, passive components, for example, surface mounting technology (SMT) components including an inductor, a capacitor, or the like, may be disposed on surfaces of the first and second passivation layers 151 and 152, if necessary.

FIGS. 11 through 15 are schematic views illustrating processes of manufacturing the fan-out semiconductor package of FIG. 9.

Figure 11:
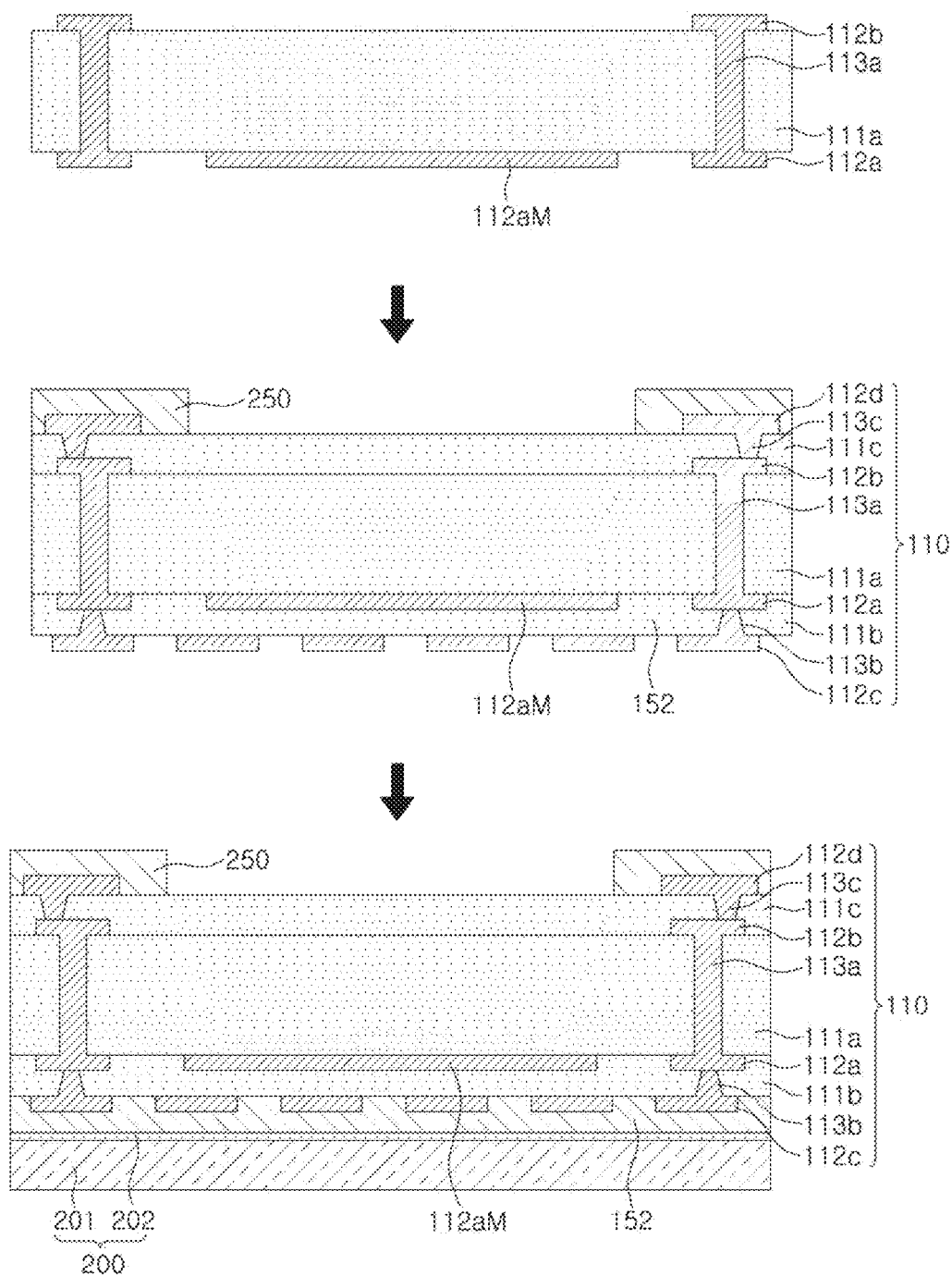
FIGS. 11 through 15 are schematic views illustrating processes of manufacturing the fan-out semiconductor package of FIG. 9.

First, referring to FIG. 11, the first insulating layer 111a may be prepared using a copper clad laminate (CCL), or the like, and the first and second wiring layers 112a and 112b, the stopper layer 112aM, and the first connection via layers 113a may be formed on and in the first insulating layer 111a by a suitable plating process. Via holes for the first connection via layers 113a may be formed using a mechanical drill, a laser drill, or the like. Then, the second and third insulating layers 111b and 111c may be formed on opposite surfaces of the first insulating layer 111a, respectively. The second and third insulating layers 111b and 111c may be formed by laminating and then hardening an ABF, or the like. Then, the third and fourth wiring layers 112c and 112d and the second and third connection via layers 113b and 113c may be formed on and in the second and third insulating layers 111b and 111c, respectively, by a suitable plating process. Via holes for the second and third connection via layers 113b and 113c may also be formed using a mechanical drill, a laser drill, or the like. A patterned dry film 250 may be formed on the third insulating layer 111c. The second passivation layer 152 may be formed on a first surface of the frame 110 prepared by a series of processes, and a carrier film 200 such as a DCF, including an insulating layer 201 and a metal layer 202 may be attached to the second passivation layer 152.

The second passivation layer 152 may be introduced using a GCP material. In addition, a dry film 250 such as a dry film photoresist (DFR) may be attached to a second surface of the frame 110.

Figure 12:
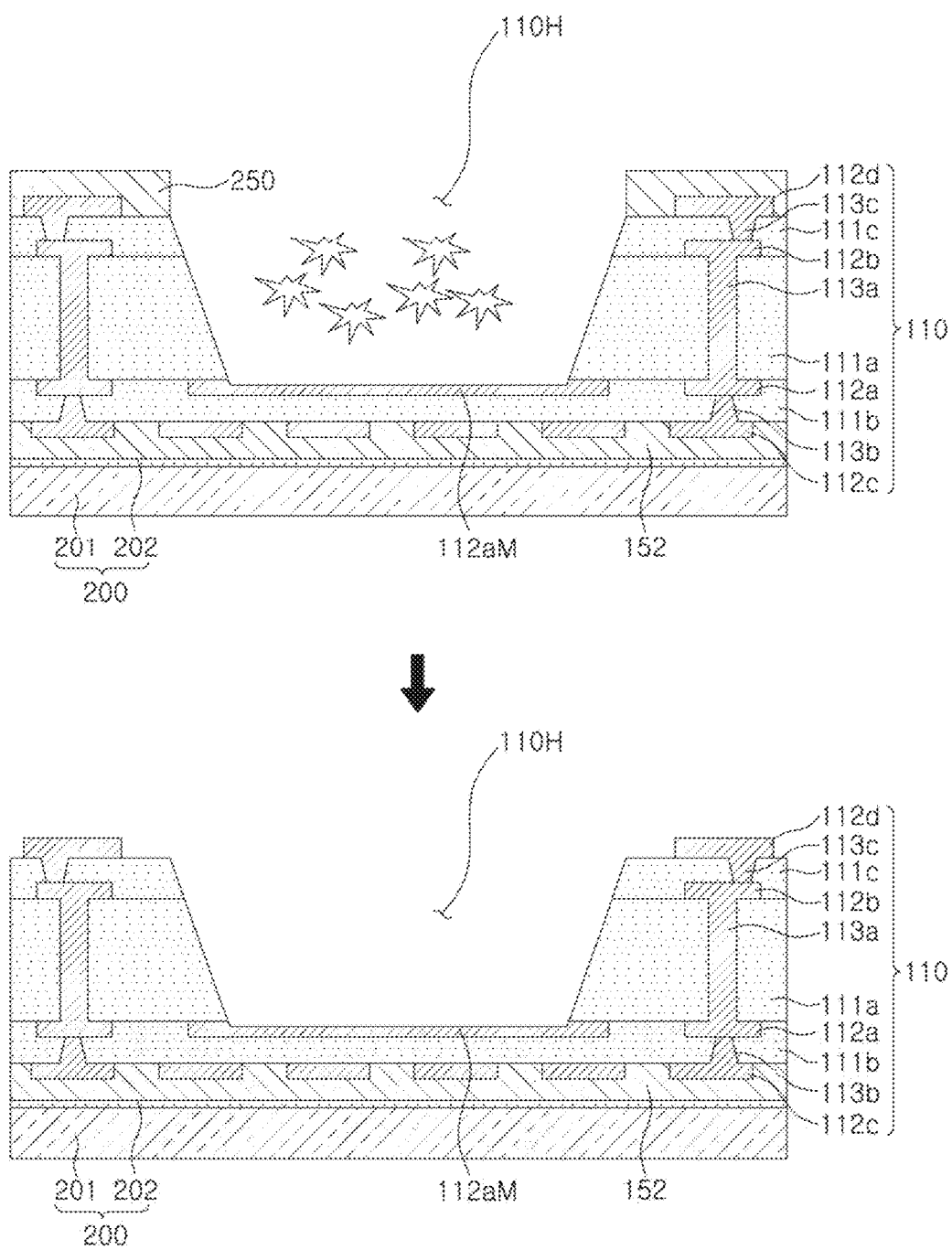

Then, referring to FIG. 12, the recess portion 110H penetrating through the first and third insulating layers 111a and 111c may be formed by a suitable process such as, for example, a sandblast process. In this case, the stopper layer 112aM may serve as a stopper. The formed recess portion 110H may have the tapered shape. After the recess portions 110H are formed, the dry films 250 may be removed.

Figure 13:
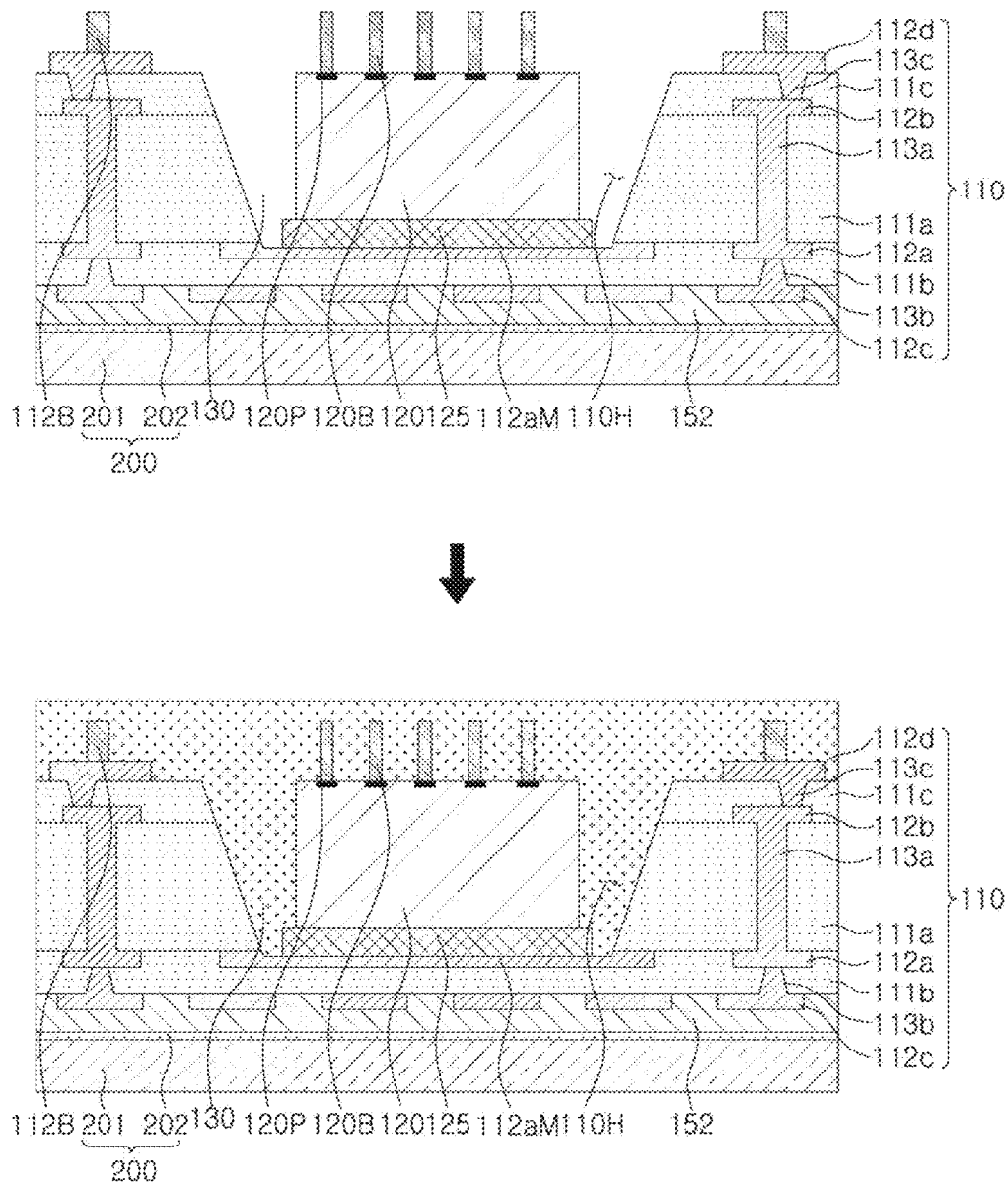

Then, referring to FIG. 13, the semiconductor chip 120 may be disposed in the recess portion 110H so that the inactive surface is attached to the stopper layer 112aM. Any known adhesive member 125 such as a DAF may be used to attach the inactive surface to the stopper layer 112aM. Meanwhile, the semiconductor chip 120 may be attached in a state in which the metal bumps 120B such as the copper post are formed on the connection pads 120P. In addition, the metal bumps 112B such as the copper posts may be formed on the fourth wiring layer 112d of the frame 110. Then, at least portions of the frame 110 and the semiconductor chip 120 may be encapsulated using the encapsulant 130. The encapsulant 130 may be formed by laminating and then hardening an ABF, or the like. The encapsulant 130 may cover the respective metal bumps 120B and 112B.

Figure 14:
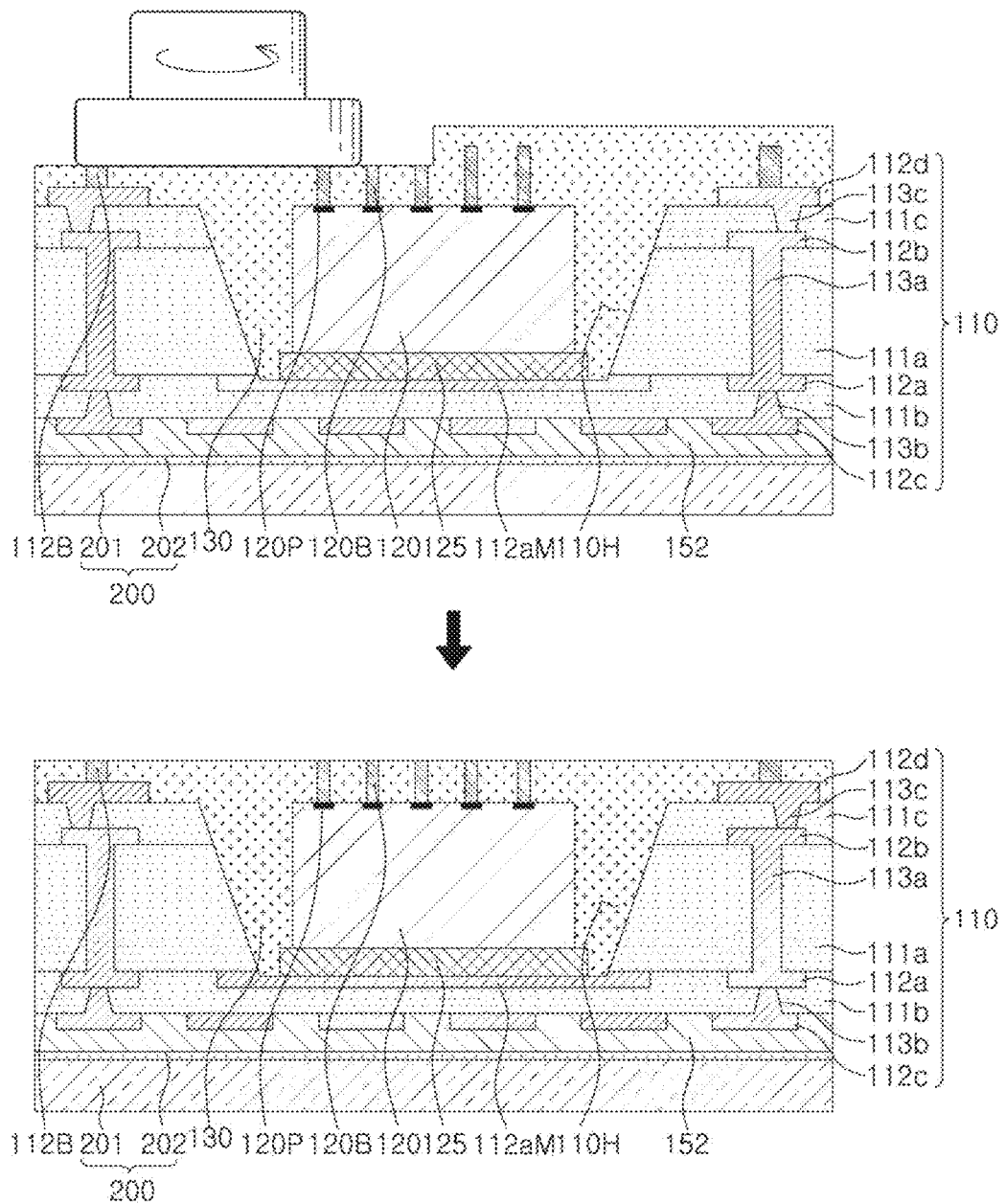

Then, referring to FIG. 14, the encapsulant 130 may be ground so that surfaces of the metal bumps 120B and 112B are exposed. A surface of the encapsulant 130 may become flat by the grinding, and the surfaces of the metal bumps 120B and 112B may be exposed from the encapsulant 130. That is, the fourth wiring layer 112d may not be ground in the grinding process. Since the surfaces of the metal bumps 120B and 112B generally have the surface areas smaller than that of the surface of the wiring layer 112d, even though the surfaces of the metal bumps 120B and 112B are ground in the grinding process, the generation of the copper residues may be significantly decreased. Resultantly, the foreign materials stuck to the grinding wheel may be decreased, such that the processability may be improved.

Figure 15:
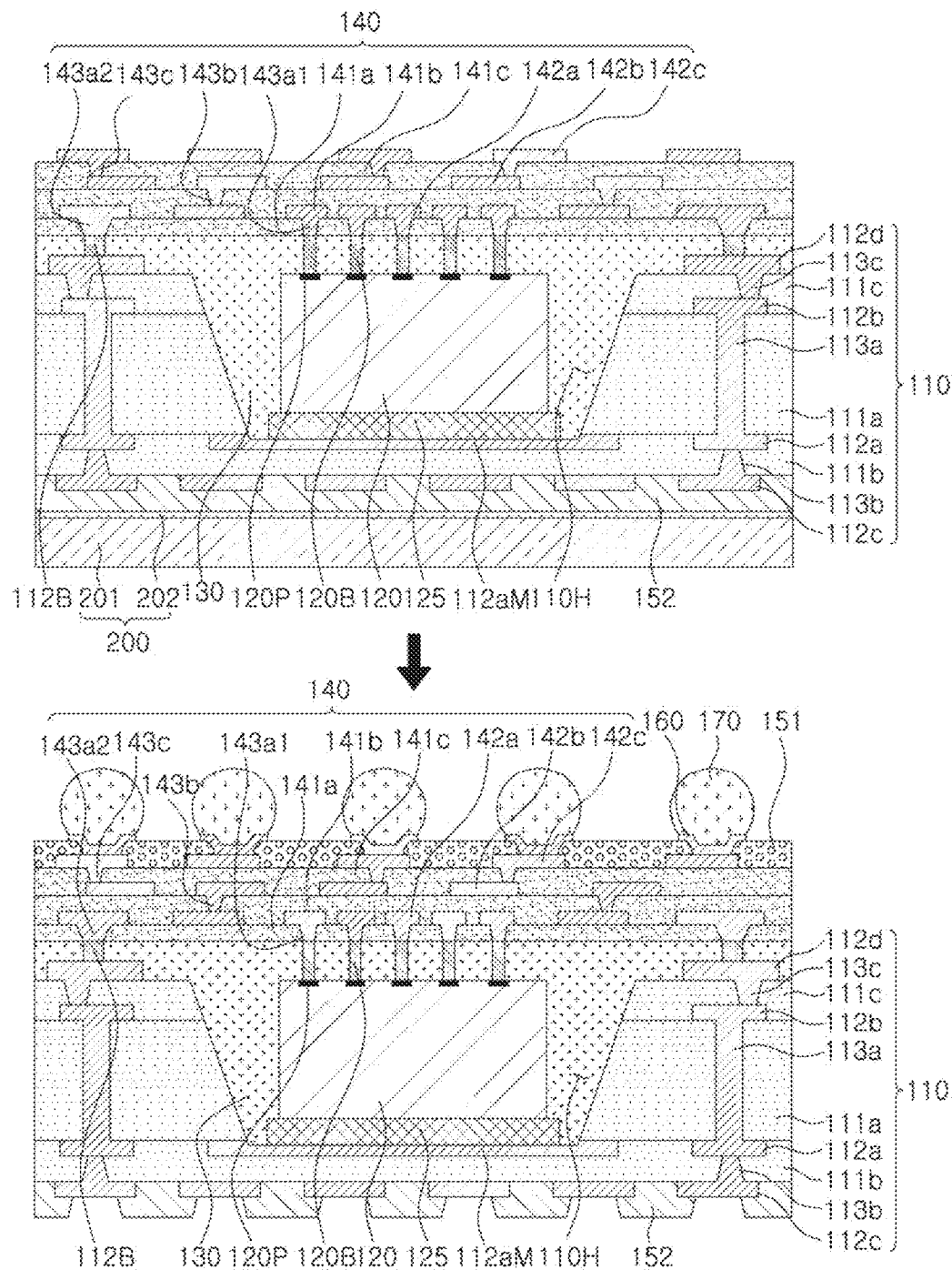

Then, referring to FIG. 15, a PID may be applied to the encapsulant 130 and be then hardened to form the first insulating layer 141a, and the first redistribution layer 142a and the first connection vias 143a1 and 143a2 may be formed on and in the first insulating layer 141a by a plating process. Via holes may be formed by a photolithography method using exposure and development. Then, the second and third insulating layers 141b and 141c, the second and third redistribution layers 142b and 142c, and the second and third connection vias 143b and 143c may be formed depending on a design. The connection member 140 may be formed by a series of processes. Then, the first passivation layer 151 may be formed on the connection member 140 by laminating and then hardening an ABF, or the like, and the carrier film 200 may be removed. Then, the underbump metal layers 160 may be formed by any known metallization method, and the electrical connection structures 170 may be formed by a reflow process using solder balls, or the like. The fan-out semiconductor package 100 according to the exemplary embodiment may be manufactured using a series of processes.

As set forth above, according to the exemplary embodiment in the present disclosure, a fan-out semiconductor package in which a frame including a blind recess portion is provided and a semiconductor chip is disposed in the recess portion, and a problem such as copper (Cu) burring, or the like, may thus be solved in spite of using a grinding process may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
   a frame including
   a plurality of insulating layers,
   a plurality of wiring layers disposed on the plurality of insulating layers, and
   a plurality of connection via layers penetrating through the plurality of insulating layers and electrically connecting the plurality of wiring layers to each other, and the frame having a recess portion having a bottom layer disposed on a bottom surface thereof;
   a semiconductor chip having
   connection pads,
   an active surface on which the connection pads are disposed, and
   an inactive surface opposing the active surface, and being disposed in the recess portion so that the inactive surface faces the bottom layer;
   first metal bumps disposed on the connection pads of the semiconductor chip;
   second metal bumps disposed on an uppermost wiring layer of the plurality of wiring layers;
   an encapsulant covering at least portions of each of the frame, the semiconductor chip, and the first and second metal bumps and filling at least portions of the recess portion, wherein an upper surface of the encapsulant is coplanar with upper surfaces of each of the first and second metal bumps; and
   a connection member including an insulating layer disposed on the coplanar upper surfaces of the encapsulant and first and second metal bumps to face the frame and the active surface of the semiconductor chip, a redistribution layer disposed on the insulating layer, and first and second connection vias penetrating through the insulating layer and integrated with the redistribution layer, the redistribution layer connected to the first and second metal bumps through the first and second connection vias, respectively.

2. The fan-out semiconductor package of claim 1, wherein the first and second metal bumps are copper (Cu) posts.

3. The fan-out semiconductor package of claim 2, wherein each of the first and second metal bumps has a rectangular cross-sectional shape.

4. The fan-out semiconductor package of claim 1, wherein the plurality of insulating layers include a core insulating layer, one or more first build-up insulating layers disposed on a lower surface of the core insulating layer, and one or more second build-up insulating layers disposed on an upper surface of the core insulating layer, and
   the core insulating layer has a thickness greater than that of each of the first and second build-up insulating layers.

5. The fan-out semiconductor package of claim 4, wherein the number of first build-up insulating layers and the number of second build-up insulating layers are the same as each other.

6. The fan-out semiconductor package of claim 4, wherein the recess portion penetrates through at least the core insulating layer and penetrates through at least one of the one or more first and second build-up insulating layers.

7. The fan-out semiconductor package of claim 1, wherein a region of the bottom layer exposed by the recess portion has a thickness smaller than that of an edge region of the bottom layer that is not exposed.

8. The fan-out semiconductor package of claim 4, wherein first connection vias penetrating through the first build-up insulating layer and second connection vias penetrating through the second build-up insulating layer are tapered in opposite directions to each other.

9. The fan-out semiconductor package of claim 1, wherein walls of the recess portion are tapered.

10. The fan-out semiconductor package of claim 1, wherein the inactive surface of the semiconductor chip is attached to the bottom layer through an adhesive member.

11. The fan-out semiconductor package of claim 1, wherein the bottom layer is a metal layer,
    at least one of the plurality of wiring layers includes a ground, and
    the metal layer is electrically connected to the ground.

12. The fan-out semiconductor package of claim 1, wherein the bottom layer has a planar area greater than that of the inactive surface of the semiconductor chip.

13. The fan-out semiconductor package of claim 1, wherein the bottom surface of the recess portion has a planar area greater than that of the inactive surface of the semiconductor chip.

14. The fan-out semiconductor package of claim 1, further comprising:
    a first passivation layer disposed on the connection member and having openings exposing at least portions of the redistribution layer;
    underbump metal layers disposed in the openings of the first passivation layer and connected to at least portions of the exposed redistribution layer; and
    electrical connection structures disposed on the first passivation layer and connected to the underbump metal layers.

15. The fan-out semiconductor package of claim 14, further comprising a second passivation layer disposed beneath the frame and having openings exposing at least portions of a lowermost wiring layer of the plurality of wiring layers.

16. The fan-out semiconductor package of claim 1, wherein at least one of the wiring layers are disposed on a level below the bottom layer.

17. A fan-out semiconductor package, comprising:
    a frame having a recess having a bottom layer disposed on a bottom surface of the recess, and having wiring layers disposed on each of an upper and a lower surface of the frame;
    a semiconductor chip having an active surface and an inactive surface and being disposed in the recess such that the inactive surface contacts the bottom layer, the active surface comprising connection pads;
    first metal bumps disposed on the connection pads of the semiconductor chip;
    second metal bumps disposed on an uppermost wiring layer disposed on the frame;
    an encapsulant covering at least portions of the frame, the semiconductor chip, the first metal bumps and the second metal bumps and filling at least a portion of the recess, wherein an upper surface of the encapsulant is coplanar with upper surfaces of each of the first and second metal bumps; and a connection member including an insulating layer disposed on the coplanar upper surfaces of the encapsulant and first and second metal bumps to face the frame and the active surface of the semiconductor chip, a redistribution layer disposed on the insulating layer, and first and second connection vias penetrating through the insulating layer and integrated with the redistribution layer, the redistribution layer connected to the first and second metal bumps through the first and second connection vias, respectively.

18. The fan-out semiconductor package of claim 17, wherein each of the first and second metal bumps has a rectangular cross-sectional shape.

\* \* \* \* \*